United States Patent
Yang

(10) Patent No.: US 11,881,864 B2
(45) Date of Patent: Jan. 23, 2024

(54) ALL-DIGITAL PHASE-LOCKED LOOP AND CALIBRATION METHOD THEREOF

(71) Applicant: Realtek Semiconductor Corp., HsinChu (TW)

(72) Inventor: Yu-Che Yang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 66 days.

(21) Appl. No.: 17/739,197

(22) Filed: May 9, 2022

(65) Prior Publication Data

US 2022/0360268 A1 Nov. 10, 2022

(30) Foreign Application Priority Data

May 10, 2021 (TW) .................... 110116671

(51) Int. Cl.
*H03L 7/085* (2006.01)
*H03L 7/099* (2006.01)

(52) U.S. Cl.
CPC ............ *H03L 7/085* (2013.01); *H03L 7/0991* (2013.01); *H03L 2207/50* (2013.01)

(58) Field of Classification Search
CPC ..... H03L 2207/50; H03L 7/085; H03L 7/093; H03L 7/0991; H03L 7/0992; H03L 7/0993; H03L 7/0994; H03L 7/097; H03L 7/095; H03L 7/087
See application file for complete search history.

(56) References Cited

U.S. PATENT DOCUMENTS

| | | | | |
|---|---|---|---|---|
| 8,570,082 B1* | 10/2013 | Kuo | ......................... | H03L 1/00 327/158 |
| 2002/0131538 A1* | 9/2002 | Staszewski | ............... | H03L 7/18 375/355 |
| 2011/0227621 A1* | 9/2011 | Ridgers | .................. | G04F 10/00 327/159 |

FOREIGN PATENT DOCUMENTS

CN 103219993 B 3/2017

OTHER PUBLICATIONS

Robert Bogdan Staszewski, John L.Wallberg, Sameh Rezeq, Chih-Ming Hung, Oren E. Eliezer, Sudheer K. Vemulapalli, Chan Fernando, Ken Maggio, Roman Staszewski, Nathen Barton, Meng-Chang Lee, Patrick Cruise, Mitch Entezari, Khurram Muhammad, Dirk Leipold, "All-Digital PLL and Transmitter for Mobile Phones", JSSC, Dec. 2005,IEEE, USA.

* cited by examiner

*Primary Examiner* — Khanh C Tran
(74) *Attorney, Agent, or Firm* — Winston Hsu

(57) ABSTRACT

An all-digital phase-locked loop (ADPLL) and a calibration method thereof are provided. The ADPLL includes a digitally controlled oscillator (DCO), a time-to-digital converter (TDC) coupled to the DCO, and a normalization circuit coupled to the TDC. The DCO is configured to generate a clock signal according to a frequency control signal. The TDC is configured to generate a digital output signal according to a phase error between the clock signal and a reference signal. The normalization circuit is configured to convert the digital output signal into a clock phase value according to a gain parameter. More particularly, the normalization circuit may modify the gain parameter according to a phase error value between the clock phase value and a reference phase value.

13 Claims, 9 Drawing Sheets

ALL-DIGITAL PHASE-LOCKED LOOP AND CALIBRATION METHOD THEREOF

BACKGROUND OF THE INVENTION

1. Field of the Invention

The present invention is related to all-digital phase-locked loops (ADPLLs), and more particularly, to an ADPLL and a calibration method thereof such as a gain calibration method for a time-to-digital converter (TDC) within the ADPLL.

2. Description of the Prior Art

In operations of an all-digital phase-locked loop (ADPLL), a time-to-digital converter (TDC) may be utilized as a phase detector to convert a phase error between a reference signal and an output signal of a digitally controlled oscillator (DCO) into a digital code for performing subsequent processing in a digital domain. The TDC may have partial features of analog circuits, however. For example, resolution of the TDC may vary due to process-voltage-temperature (PVT) variations. As this varying resolution of the TDC may impact setting values of some parameters within the ADPLL, an estimation error of the resolution of the TDC may impact an overall performance of the ADPLL.

Thus, there is a need for a novel architecture and an associated calibration method that can make parameters related to the TDC (e.g., a gain of the TDC) properly converge to a correct or optimized value under various process variations and temperature conditions.

SUMMARY OF THE INVENTION

An objective of the present invention is to provide an all-digital phase-locked loop (ADPLL) and a calibration method thereof, in order to make the parameters related to a time-to-digital converter (TDC) such as a gain of the TDC converge to a correct or optimized value without introducing any side effect or in a way that is less likely to introduce side effects.

At least one embodiment of the present invention provides an ADPLL, wherein the ADPLL may comprise a digitally controlled oscillator (DCO), a TDC coupled to the DCO, and a normalization circuit coupled to the TDC. The DCO may be configured to generate a clock signal according to a frequency control signal. The TDC may be configured to generate a digital output signal according to a phase error between the clock signal and a reference signal. The normalization circuit may be configured to convert the digital output signal into a clock phase value according to a gain parameter. More particularly, the normalization circuit modifies the gain parameter according to a phase error value between the clock phase value and a reference phase value.

At least one embodiment of the present invention provides a calibration method of an ADPLL, wherein the calibration method may comprise: utilizing a DCO of the ADPLL to generate a clock signal according to a frequency control signal; utilizing a TDC of the ADPLL to generate a digital output signal according to a phase error between the clock signal and a reference signal; utilizing a normalization circuit of the ADPLL to convert the digital output signal into a clock phase value according to a gain parameter; and utilizing the normalization circuit to modify the gain parameter according to a phase error value between the clock phase value and a reference phase value.

The ADPLL and the calibration method thereof provided by the embodiments of the present invention can determine a direction or tendency of an error of the gain parameter, and establish a feedback calibration mechanism to make the gain parameter gradually converge to a correct value. The calibration method of the present invention is not limited to resolution of the TDC. In addition, the ADPLL and calibration method will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

In operations of an all-digital phase-locked loop (ADPLL), assume that a cycle period of a clock signal CKV output by a digitally controlled oscillator (DCO) is $T_V$, and a time-to-digital converter (TDC) generates a digital output signal $N_r$ according to a phase error between the clock signal and a reference signal FREF (e.g., a time difference $\Delta t_r$ between a rising edge of the clock signal CKV and a rising edge of the reference signal FREF). The ADPLL needs to perform normalization on the digital output signal $N_r$ to convert the digital output signal $N_r$ into a value $\varnothing_{DCO}$ within a range from 0 to 1 (e.g., a value representing the phase error between the clock signal CKV and the reference signal FREF as $\varnothing_{DCO}$ times the cycle period $T_V$) for subsequent operations. The result of the above normalization may be affected by resolution $\Delta t_{res}$ of the TDC (e.g., a time difference corresponding to a least significant bit (LSB) of the digital output signal of the TDC, or a unit delay of the TDC), where $\emptyset_{DCO}=N_r\times\Delta t_{res}/T_v$, and the resolution $\Delta t_{res}$ of the TDC may vary due to process-voltage-temperature (PVT) variation of semiconductors. Thus, the operation of the normalization mentioned above needs to be calibrated in response to the varying resolution.

Figure 1:
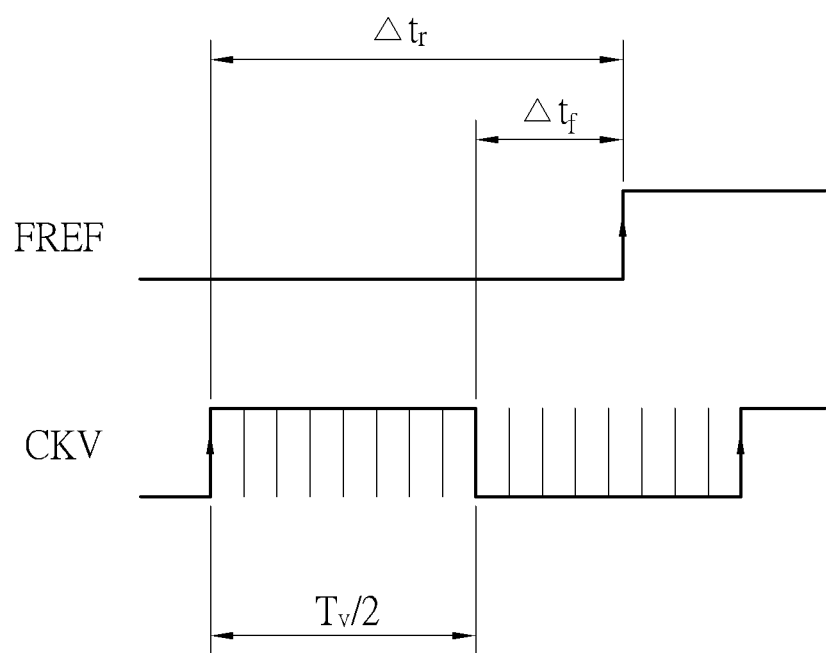
FIG. 1 is a diagram illustrating resolution of a time-to-digital converter (TDC) according to an embodiment of the present invention.

FIG. 1 is a diagram illustrating the resolution $\Delta t_{res}$ of a TDC according to an embodiment of the present invention. As shown in FIG. 1, the TDC may detect a time difference $\Delta t_r$ between a rising edge of the clock signal CKV and a rising edge of the reference signal FREF, and may further detect a time difference $\Delta t_f$ between a falling edge of the clock signal CKV and the rising edge of the reference signal FREF. As shown in FIG. 1, a difference value between $\Delta t_r$ and $\Delta t_f$ is a half cycle period $T_v/2$ of the clock signal CKV, and the TDC (or subsequent processing circuit thereof) may utilize respective digital output signals which are respectively output according to $\Delta t_r$ and $\Delta t_f$ to roughly calculate the resolution $\Delta t_{res}$ the TDC.

Figure 2:
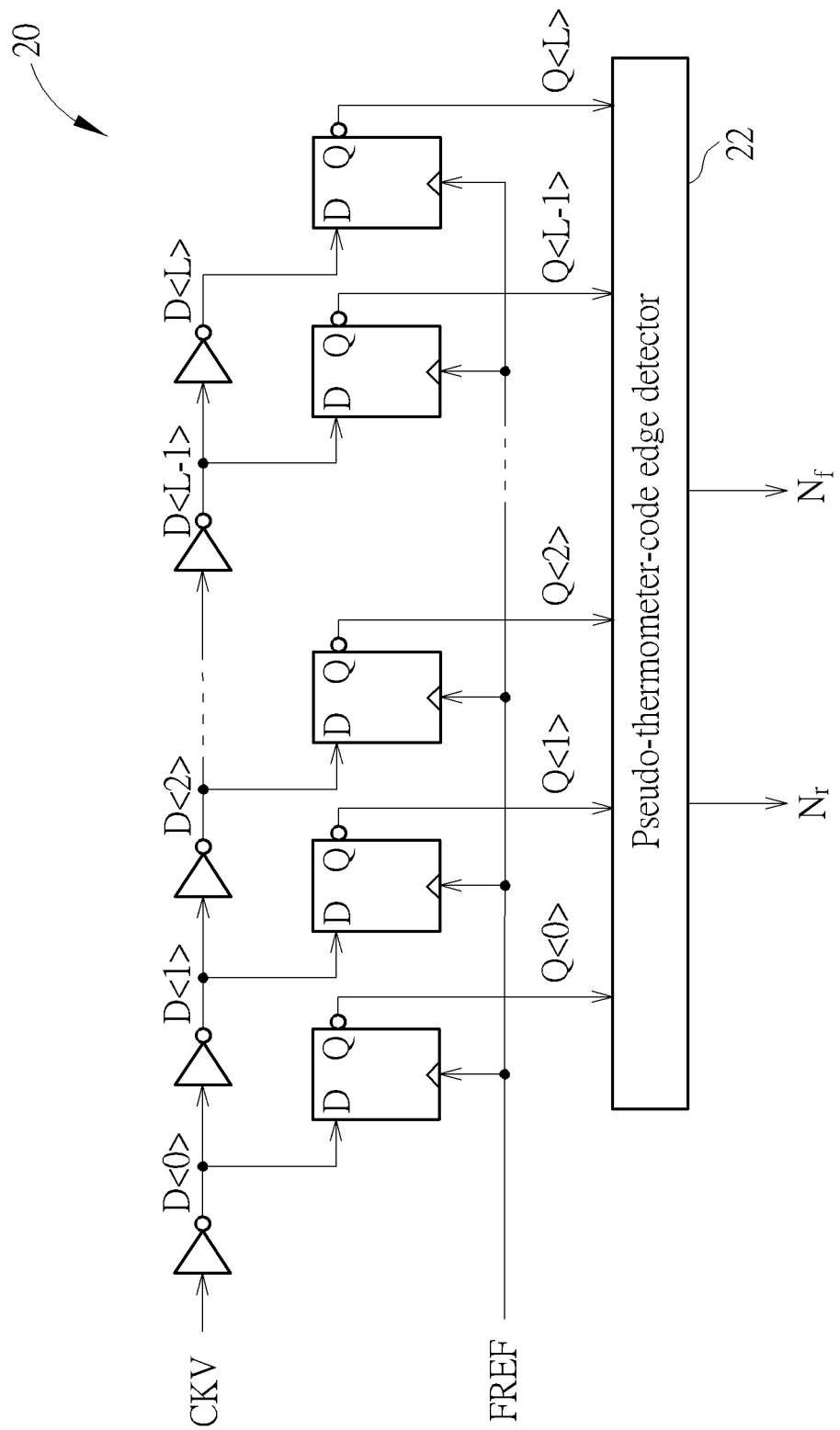
FIG. 2 illustrates a circuit architecture of a TDC according to an embodiment of the present invention.
Figure 3:
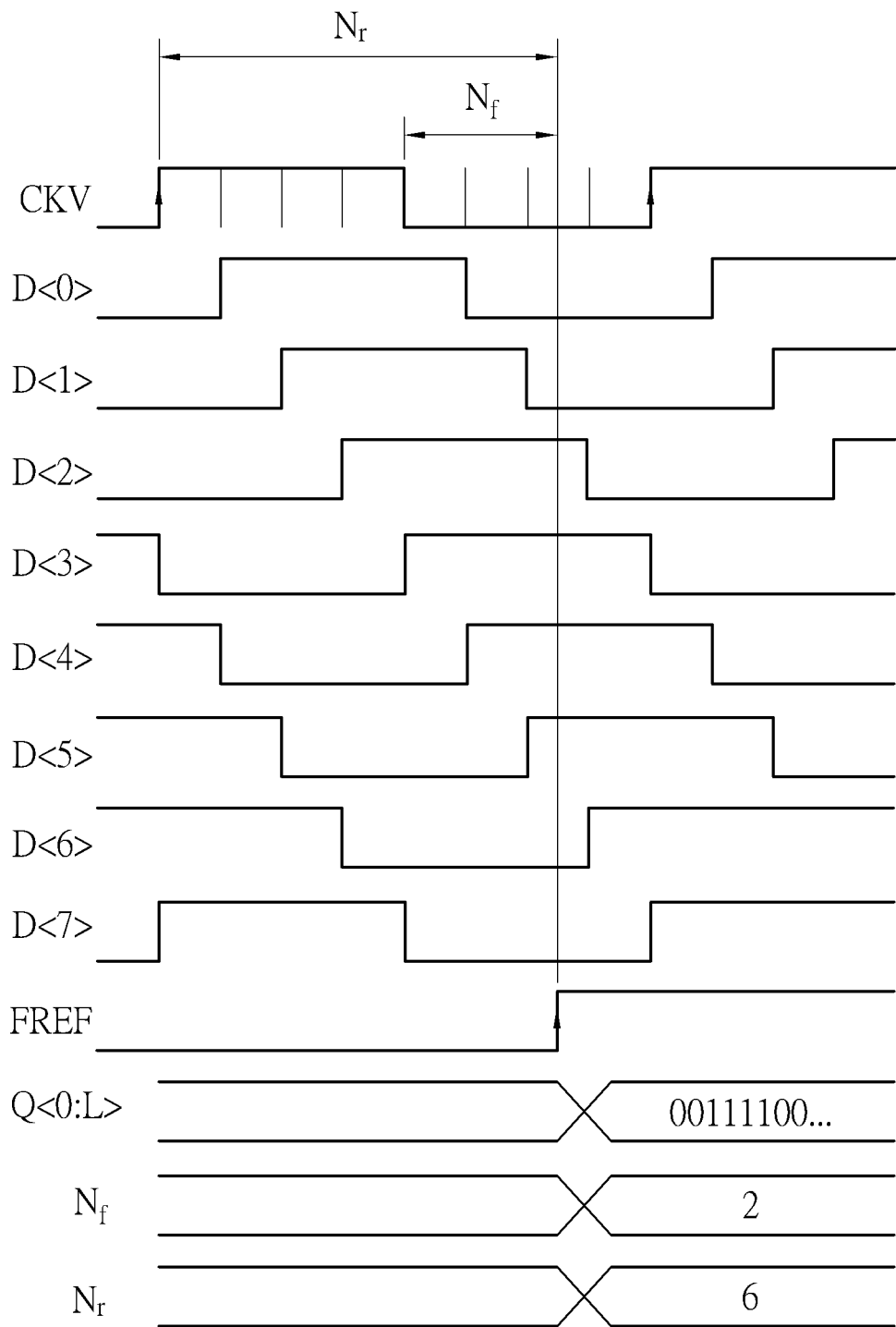
FIG. 3 illustrates some signals which are involved in the circuit architecture shown in FIG. 2.

FIG. 2 illustrates a circuit architecture of a TDC 20 according to an embodiment of the present invention, and FIG. 3 illustrates some signals which are involved in the circuit architecture shown in FIG. 2. It should be noted that the circuit architecture shown in FIG. 2 is an example of the TDC 20 only, and is not meant to be a limitation of the present invention. As shown in FIG. 2, the TDC 20 may comprise multiple inverters connected in series to form an inverter chain. As each inverter of these inverters may cause a delay of a signal, respective output signals D<0>, D<1>, D<2>, ..., D<L–1> and D<L> of these inverters may have corresponding delay periods relative to the clock signal CKV which is input to a first inverter of these inverters, as illustrated by D<0>, D<1>, D<2>, D<3>, D<4>, D<5>, D<6> and D<7> shown in FIG. 3, where a delay amount introduced by one inverter may be the resolution $\Delta t_{res}$ of the TDC 20. In this embodiment, each of the output signals D<0>, D<1>, D<2>, ..., D<L–1> and D<L> may be input to an input terminal (which is labeled "D") of a flip-flop, and may be output from an output terminal (labeled "Q") of the flip-flop when the flip-flop is triggered by the rising edge of the reference signal FREF, as illustrated by Q<0:L> shown in FIG. 3. In this embodiment, a portion of the output signals Q<0:L> which are changed from 0 to 1 (e.g., Q<1> is 0 and Q<2> is 1) may represent the falling edge of the clock signal CKV, and a portion of the output signals Q<0:L> which are changed from 1 to 0 (e.g., Q<5> is 1 and Q<6> is 0) may represent the rising edge of the clock signal CKV. The TDC 20 may utilize a pseudo-thermometer-code edge detector 22 (e.g., a detector configured to detect a change from 0 to 1 and a change from 1 to 0 in a digital sequence) therein to detect the output signals Q<0:L> and accordingly output digital output signals $N_r$ and $N_f$ in a binary format, for respectively representing the time difference $\Delta t_r$ between the rising edge of the clock signal CKV and the rising edge of the reference signal FREF and the time difference $\Delta t_f$ between the falling edge of the clock signal CKV and the rising edge of the reference signal FREF (e.g., $\Delta t_r \approx N_r\times\Delta t_{res}$ and $\Delta t_f \approx N_f\times\Delta t_{res}$). In an example, $N_r=6$ and $N_f=2$. It should be noted that the circuit architecture of TDC 20 shown in FIG. 2 is for illustrative purposes only, and is not meant to be a limitation of the present invention. For example, a bit count of each of the output signals of the TDC may vary according to requirements of the system, and L may be any positive integer.

Figure 4:
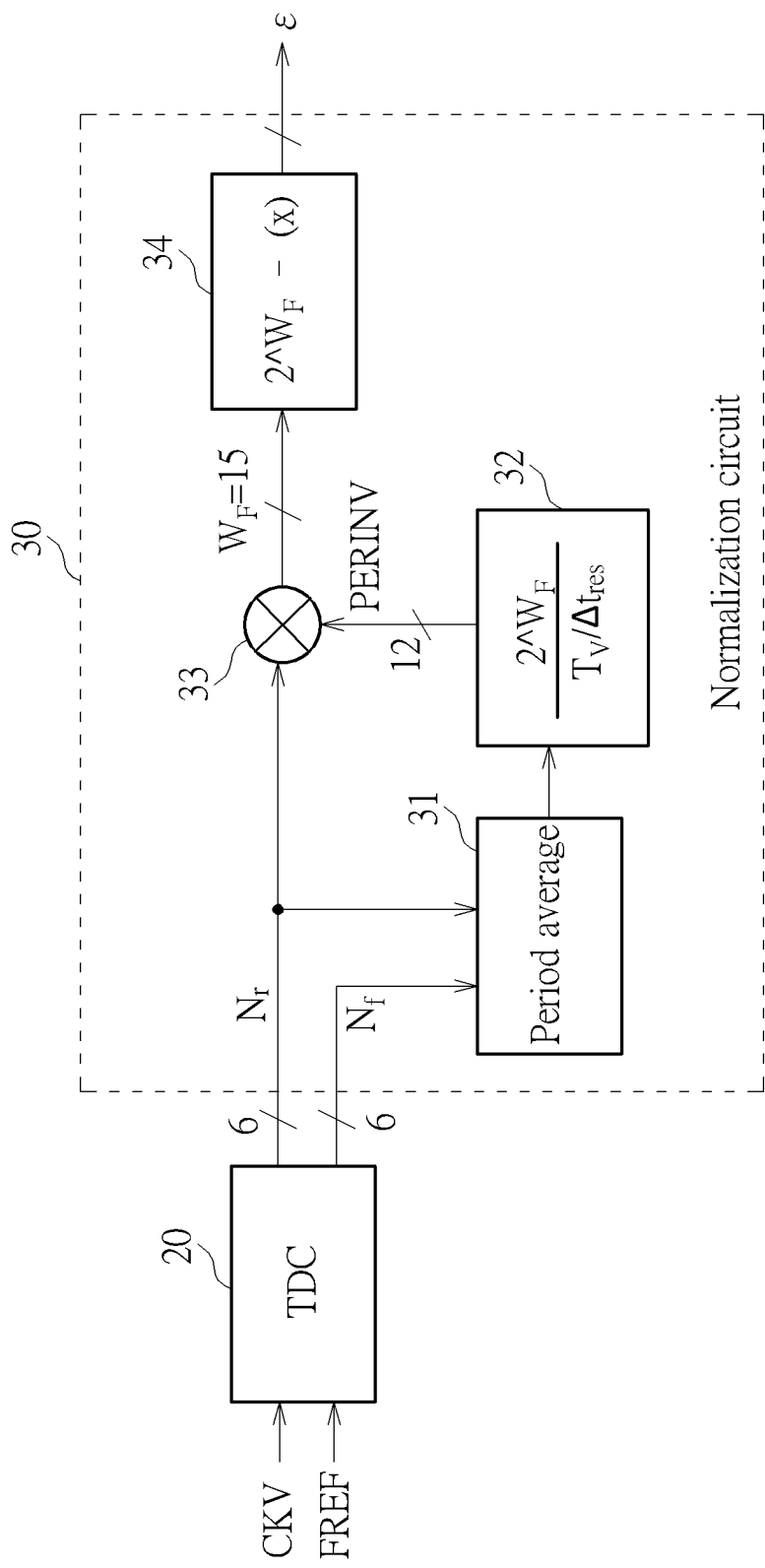
FIG. 4 is a diagram illustrating a normalization operation of a TDC according to an embodiment of the present invention.

FIG. 4 is a diagram illustrating a normalization operation of the TDC 20 according to an embodiment of the present invention. As shown in FIG. 4, the TDC 20 may transmit the digital output signal $N_r$ and $N_f$ obtained from the above operations to a normalization circuit 30. Initially, the normalization circuit 30 may utilize a first calculating unit 31 (which is labeled "Period average" for better comprehension) to perform the calculation mentioned in the embodiment of FIG. 1 to obtain an average $\overline{T_V}$ of a cycle period of the clock signal CKV and the resolution $\Delta t_{res}$ of the TDC 20, and then utilize a second calculating unit 32 (which is labeled $$\frac{2^{\wedge}W_F}{\overline{T_V}/\Delta t_{res}}$$

for better comprehension) to output the reciprocal of $\overline{T_V}/\Delta t_{res}$ in a binary form (e.g., a signal PERINV). The normalization circuit 30 further utilizes a multiplier 33 to multiply the digital output signal $N_r$ by the signal PERINV to generate a $W_F$-bit multiplied result (e.g., $W_F=15$), and then finally transforms the multiplied result into an unsigned 2's complement form via a third calculating unit 34 (which is labeled "$2^{\wedge}W_F$-(x)") to output a signal $\varepsilon$, where the $W_F$-bit binary signal $\varepsilon$ may be illustrated in a manner of discrete data (e.g., a $k^{th}$ set of data) as follows:

$$\varepsilon[k] = 2^{W_F} \cdot \left(1 - \frac{N_r[k]}{\overline{T_V}/\Delta t_{res}}\right)$$

It should be noted that when a duty cycle of the clock signal CKV is not 50%, the aforementioned operations of obtaining the average $\overline{T_V}$ of the cycle period of the clock signal CKV and the resolution $\Delta t_{res}$ of the TDC 20 may need to be implemented by a more complex hardware.

In addition, the estimation method mentioned above is limited by the resolution $\Delta t_{res}$ of the TDC 20, and estimation errors may exist, which degrades the performance of the ADPLL (e.g., output spur becomes too big).

Figure 5:
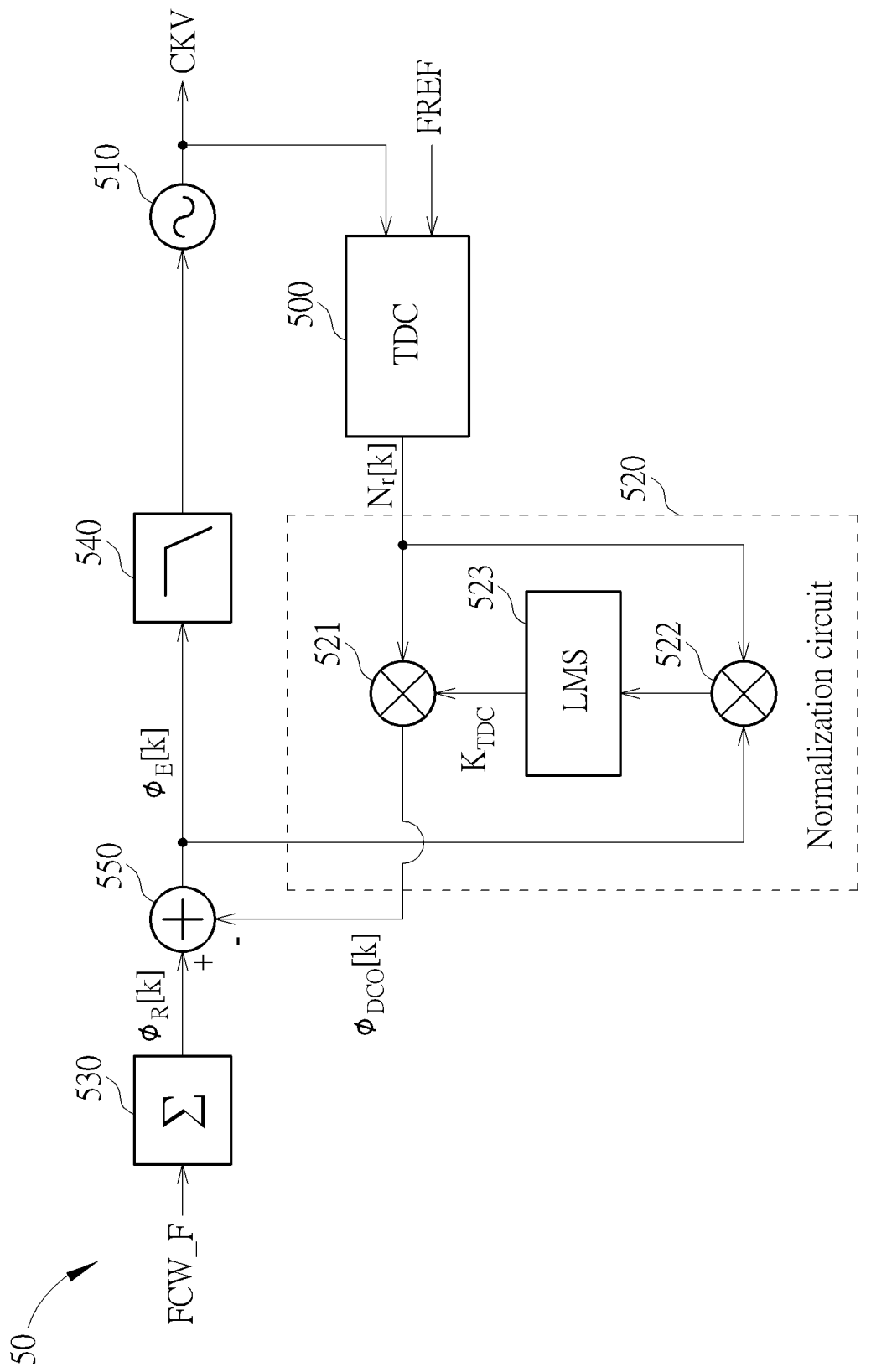
FIG. 5 is a diagram illustrating an all-digital phase-locked loop (ADPLL) according to an embodiment of the present invention.

For brevity, the following description takes values in a decimal form. FIG. 5 is a diagram illustrating an ADPLL 50 according to an embodiment of the present invention, where the ADPLL 50 may comprise a TDC 500, a digitally controlled oscillator (DCO) 510 (which is illustrated by a circle with a sine wave therein for better comprehension), a normalization circuit 520, an accumulator 530 (which is labeled "Σ" for better comprehension), a low pass filter 540 (which is illustrated by a box with a low pass response waveform therein for better comprehension) and an adder 550 (which is illustrated by a circle with "+" therein for better comprehension). In this embodiment, a parameter FCW_F may be set as a ratio value between a target frequency of the clock signal CKV and a frequency of the reference frequency FREF, and the accumulator 530 may continuously accumulate the parameter FCW_F to output an accumulated result as a reference phase. The TDC 500 may be coupled to the DCO 510, and may be configured to generate a digital output signal $N_r[k]$ (e.g.) according to a phase error between the clock signal CKV and the reference signal FREF. The normalization circuit 520 may be coupled to the TDC 500, and may be configured to convert the digital output signal $N_r[k]$ into a clock phase value $\emptyset_{DCO}[k]$ (e.g., a value of $\emptyset_{DCO}$ at the $k^{th}$ cycle of the reference signal FREF) according to a gain parameter $K_{TDC}$, where the clock phase value $\emptyset_{DCO}[k]$ may be regarded as a result of performing normalization on the digital output signal $N_r[k]$. The adder 550 may perform subtraction on the reference phase mentioned above with a real-time phase (e.g., an accumulated result of a real-time ratio value between a real-time frequency of the clock signal CKV and the frequency of the reference signal FREF) to obtain a phase error value $Ø_E[k]$ (e.g., a value of $Ø_E$ at the $k^{th}$ cycle of the reference signal FREF), and the low pass filter 540 may generate a frequency control signal according to the phase error value $Ø_E[k]$, in order to control the DCO 510 to generate the clock signal CKV according to the frequency control signal, and thereby makes the real-time frequency of the clock signal CLK gradually approach the target frequency.

It should be noted that the digital output signal $N_r[k]$ generated by the TDC 500 and the clock phase value $Ø_{DCO}[k]$ after the normalization are merely configured to represent a fractional portion of the real-time phase, and an integer portion of the real-time phase may be calculated by a counter. As operations of utilizing the counter to generate the integer portion of the real-time phase are well-known by those skilled in this art, and do not affect implementation of calibration of the TDC 500 and the normalization circuit 520, the counter is not shown in FIG. 5 for brevity, and related details are omitted here for brevity. Similarly, a reference phase value $Ø_R[k]$ (e.g., a value of $Ø_R$ at the $k^{th}$ cycle of the reference signal FREF) output by the accumulator 530 shown in FIG. 5 merely represents a fractional portion of the reference phase mentioned above for brevity.

In the embodiment of FIG. 5, the normalization circuit 520 may comprise a multiplier 521, configured to multiply the digital output signal $N_r[k]$ by the gain parameter $K_{TDC}$ to generate the clock phase value $Ø_{DCO}[k]$, and a correct value of the gain parameter $K_{TDC}$ may be obtained by the following equation:

$$K_{TDC} = \frac{t_{res}}{T_{DCO}}$$

where $t_{res}$ may represent resolution of the TDC 500 (e.g., $\Delta t_{res}$ mentioned above), and $T_{DCO}$ may represent a cycle period of the clock signal CKV output from the DCO 510 (e.g., $T_V$ or $\overline{T_V}$ mentioned above). As the resolution $t_{res}$ the TDC 500 is quite sensitive to the PVT variation (e.g., $t_{res}$ is 13 picoseconds (ps) when the temperature is 25° C., and $t_{res}$ is 10 ps when the temperature is 80° C.), the gain parameter $K_{TDC}$ may have gain error under different temperatures, and the gain error of the gain parameter may result in occurrence of unwanted frequency components such as fractional spur.

Assuming that the frequency of the reference signal FREF is 40 MHz, the ratio value FCW between the target frequency of the clock signal CKV and the frequency of the reference signal FREF is 125.25, the expected resolution $t_{res}$ is 10 ps, and the target frequency such as $f_{DCO}$ of the clock signal CKV, then the gain parameter is about 0.05.

Figure 6:
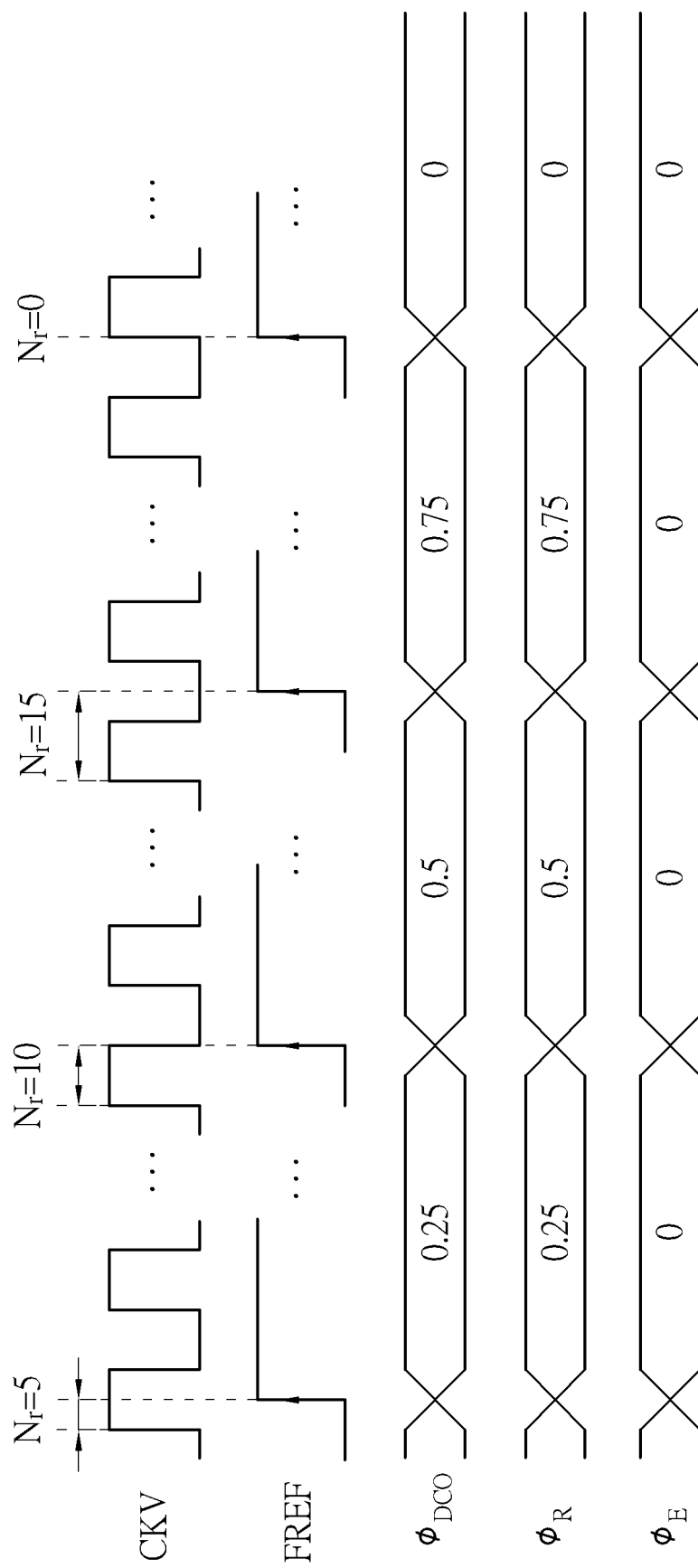
FIG. 6 illustrates some signals at a locked state under an ideal condition according to an embodiment of the present invention.
Figure 7:
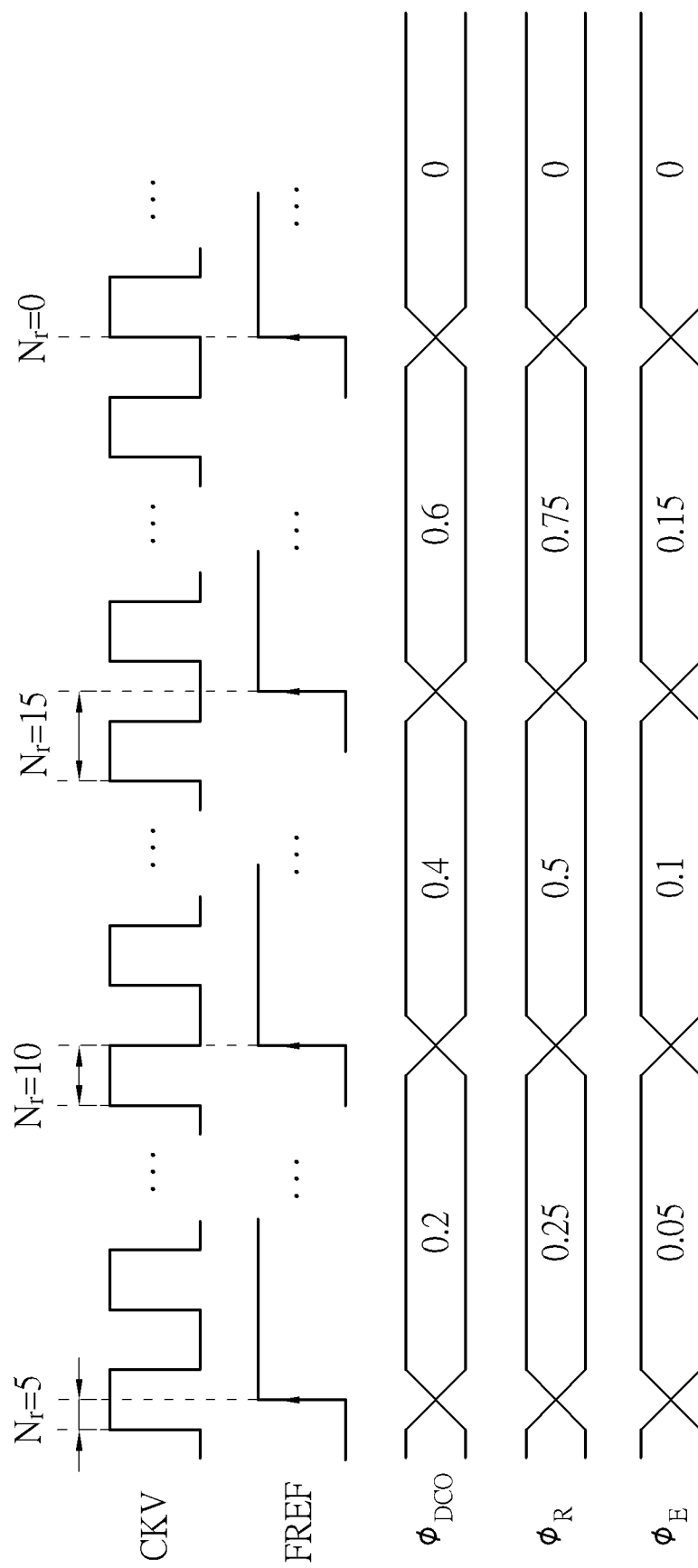
FIG. 7 illustrates some signals at a locked state when a TDC gain has −20% error according to an embodiment of the present invention.
Figure 8:
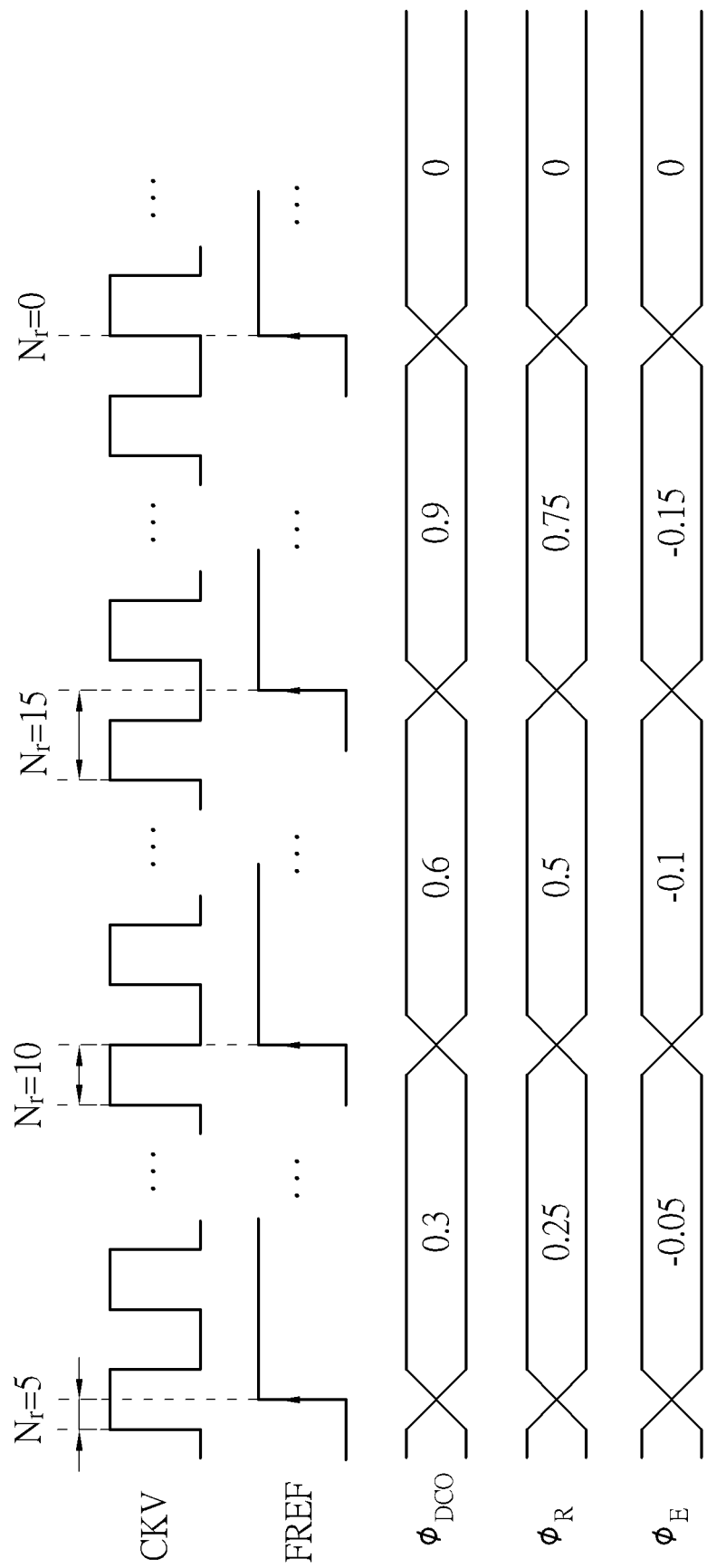
FIG. 8 illustrates some signals at a locked state when a TDC gain has +20% error according to an embodiment of the present invention.

FIG. 6 to FIG. 8 illustrate values of the clock phase $Ø_{DCO}$, the reference phase $Ø_R$, and the phase error $Ø_E$, based on the frequencies of the clock signal CKV and the reference signal FREF under different conditions. As shown in FIG. 6, in respective cycles of the reference signal FREF, the digital output signal $N_r$ is sequentially 5, 10, 15 and 0, and the reference phase $Ø_R$ is sequentially 0.25, 0.5, 0.75 and 0. Under a condition where the gain parameter $K_{TDC}$ has no gain error (e.g., both a gain parameter corresponding to actual resolution $t_{res}$ (i.e., $t_{res}/T_{DCO}$) and the value of the gain parameter $K_{TDC}$ which is set in advance are 0.05), the clock phase $Ø_{DCO}$ is sequentially 0.25, 0.5, 0.75 and 0, and therefore the phase error $Ø_E$ is kept at 0. When the gain parameter $K_{TDC}$ set in advance has −20% error (e.g., 0.04), the clock phase $Ø_{DCO}$ is sequentially 0.2, 0.4, 0.6 and 0, which makes the phase error $Ø_E$ still have a positive phase error (e.g., 0.05, 0.1, 0.15 and 0) at a locked state as shown in FIG. 7. When the gain parameter $K_{TDC}$ set in advance has +20% error (e.g., 0.06), the clock phase $Ø_{DCO}$ is sequentially 0.3, 0.6, 0.9 and 0, which makes the phase error $Ø_E$ still have a negative phase error (e.g., −0.05, −0.1, −0.15 and 0) at a locked state as shown in FIG. 8.

According to the above example, it can be observed that the gain parameter $K_{TDC}$ has correlation with the digital output signal $N_r[k]$ and the phase error $Ø_E[k]$. For example, a higher value of $N_r[k]$ may result in a high value of the phase error $Ø_E[k]$. In another example, a positive gain error of the gain parameter $K_{TDC}$ may result in a negative phase error $Ø_E[k]$, and a negative gain error of the gain parameter $K_{TDC}$ may result in a positive phase error $Ø_E[k]$.

Thus, embodiments of the present invention provide a calibration method and an associated architecture which utilize the digital output signal $N_r[k]$ and/or the phase error $Ø_E[k]$ for calibrating the gain parameter $K_{TDC}$.

As shown in FIG. 5, in addition to the multiplier 521, the normalization circuit 520 may further comprise a multiplier 522 and a least mean square (LMS) circuit 523 (which is labeled "LMS" for brevity), where the LMS circuit 523 is coupled between the multipliers 521 and 522. In this embodiment, the normalization circuit 520 may modify the gain parameter $K_{TDC}$ according to the phase error value $Ø_E[k]$ between the clock phase value $Ø_{DCO}[k]$ and the reference phase value $Ø_R[k]$. In particular, when the phase error value $Ø_E[k]$ is positive (as shown in FIG. 7), it means the gain parameter $K_{TDC}$ has a negative error (e.g. the gain parameter is less than $t_{res}/T_{DCO}$), and the normalization circuit 520 may increase the gain parameter $K_{TDC}$; and when the phase error value $Ø_E[k]$ is negative (as shown in FIG. 8), it means the gain parameter $K_{TDC}$ has a positive error (e.g. the gain parameter is greater than $t_{res}/T_{DCO}$)), and the normalization circuit 520 may decrease the gain parameter $K_{TDC}$.

In this embodiment, the normalization circuit 520 may modify the gain parameter $K_{TDC}$ according to the phase error value $Ø_E[k]$ and the digital output signal $N_r$. For example, the normalization circuit 520 may modify the gain parameter $K_{TDC}$ according to a product $Ø_E[k] \times N_r$ of the phase error value $Ø_E[k]$ and the digital output signal $N_r$. As shown in FIG. 5, the normalization circuit 520 may utilize the multiplier 522 to calculate the product $Ø_E[k] \times N_r$ of the phase error value $Ø_E[k]$ and the digital output signal $N_r$, in order to make the LMS circuit 523 modify the gain parameter $K_{TDC}$ according to a calculation result of $Ø_E[k] \times N_r$.

Figure 9:
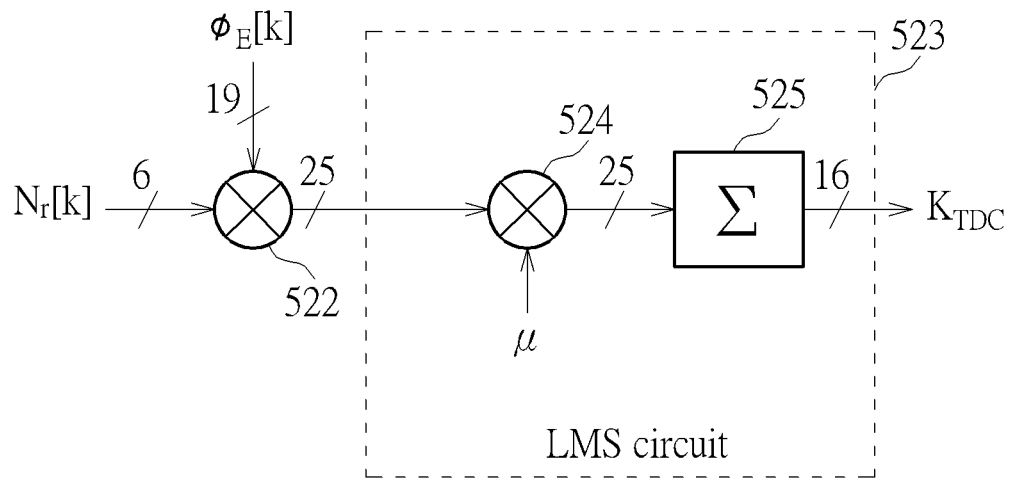
FIG. 9 is an example of a least mean square (LMS) circuit shown in FIG. 5 according to an embodiment of the present invention.

FIG. 9 is an example of the LMS circuit 523 shown in FIG. 5 according to an embodiment of the present invention. As shown in FIG. 9, the LMS circuit 523 may comprise a multiplier 524 and an accumulator 525 (which is labeled "Σ" for better comprehension). In this embodiment, the LMS circuit 523 may be configured to generate a next gain parameter $K_{TDC}[k]$ for a next cycle (e.g., the $k^{th}$ cycle of the reference signal FREF) according to the product $Ø_E[k] \times N_r$ of the phase error $Ø_E[k]$ value and the digital output signal $N_r$ and a current gain parameter $K_{TDC}[k-1]$ utilized in a current cycle (e.g., a (k−1)th cycle of the reference signal FREF). For example, the multiplier 522 may multiply a 19-bit phase error value $Ø_E[k]$ by a 6-bit digital output signal $N_r[k]$ to generate a 25-bit product $Ø_E[k] \times N_r$. The multiplier 524 may further multiply the product $Ø_E[k] \times N_r$ by a predetermined value μ, and the accumulator 525 may accumulate a multiplied result to the gain parameter $K_{TDC}[k-1]$ to obtain a 16-bit gain parameter $K_{TDC}[k]$, where the predetermined value $\mu$ may be any suitable constant value, and related calculation may be expressed in discrete data as follows:

$$K_{TDC}[k]=K_{TDC}[k-1]+\mu \cdot \{N_r[k] \cdot \emptyset_E[k]\}$$

It should be noted that the equation mentioned above and the architecture shown in FIG. 9 are merely an example of the LMS circuit 523 calibrating the gain parameter $K_{TDC}$, and is not meant to be a limitation of the present invention. As long as the gain parameter $K_{TDC}$ may be gradually modified or converge to $t_{res}/T_{DCO}$ according to the phase error value $\emptyset_E[k]$ and/or the digital output signal $N_r[k]$, alternative designs should belong to the scope of the present invention.

Figure 10:
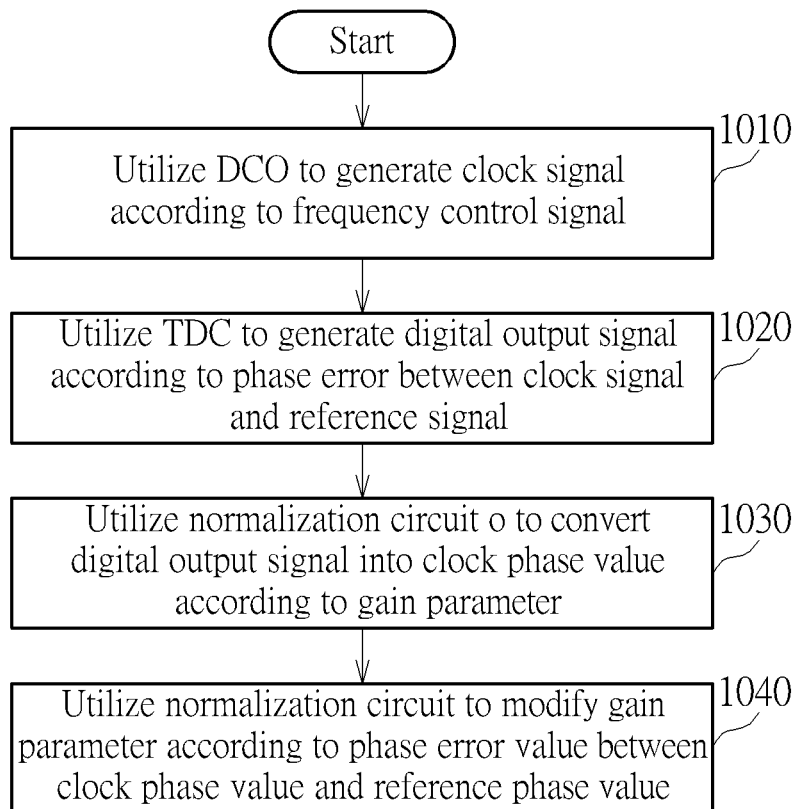
FIG. 10 is a diagram illustrating a working flow of a calibration method of an ADPLL according to an embodiment of the present invention.

FIG. 10 is a diagram illustrating a working flow of a calibration method of an ADPLL according to an embodiment of the present invention, where the calibration method is applicable to the ADPLL 50 shown in FIG. 5. It should be noted that, as long as an overall result is not hindered, one or more steps may be added, deleted or modified in the working flow shown in FIG. 10, and these steps do not have to be executed in the exact order shown in FIG. 10.

In Step 1010, the ADPLL 50 utilizes the DCO 510 to generate the clock signal CKV according to a frequency control signal.

In Step 1020, the ADPLL 50 utilizes the TDC 500 to generate the digital output signal $N_r[k]$ according to a phase error between the clock signal CKV and the reference signal FREF.

In Step 1030, the ADPLL 50 utilizes the normalization circuit 520 to convert the digital output signal $N_r[k]$ into the clock phase value $\emptyset_{DCO}[k]$ according to the gain parameter $K_{TDC}$.

In Step 1040, the ADPLL 50 utilizes the normalization circuit 520 to modify the gain parameter $K_{TDC}$ according to the phase error value $\emptyset_E[k]$ between the clock phase value $\emptyset_{DCO}[k]$ and the reference phase value $\emptyset_R[k]$.

To summarize, the embodiments of the present invention provide an ADPLL and a calibration method thereof, which can determine a direction or tendency of an error of the gain parameter $K_{TDC}$ according to the phase error value $\emptyset_E[k]$ and the signal $N_r$ output from a TDC, and establish a feedback calibration mechanism to make the gain parameter $K_{TDC}$ gradually converge to a correct value. In addition, the calibration mechanism of the present invention is not limited to resolution of the TDC, and more particularly, the accuracy and the precision of the calibration may be determined according to the design of the number of bits of calculating units (e.g., the multiplier 521 and 522, and the LMS circuit 523) within the normalization circuit 520. Thus, the present invention can make parameters related to the TDC (e.g., the gain parameter $K_{TDC}$ of the TDC) converge to a correct or optimized value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An all-digital phase-locked loop (ADPLL), comprising:
a digitally controlled oscillator (DCO), configured to generate a clock signal according to a frequency control signal;
a time-to-digital converter (TDC), coupled to the DCO, configured to generate a digital output signal according to a phase error between the clock signal and a reference signal; and
a normalization circuit, coupled to the TDC, configured to convert the digital output signal into a clock phase value according to a gain parameter;
wherein the normalization circuit modifies the gain parameter according to a phase error value between the clock phase value and a reference phase value.

2. The ADPLL of claim 1, wherein the normalization circuit multiplies the digital output signal by the gain parameter to generate the clock phase value.

3. The ADPLL of claim 1, wherein when the phase error value is positive, the normalization circuit increases the gain parameter; and when the phase error value is negative, the normalization circuit decreases the gain parameter.

4. The ADPLL of claim 1, wherein the normalization circuit modifies the gain parameter according to the phase error value and the digital output signal.

5. The ADPLL of claim 4, wherein the normalization circuit modifies the gain parameter according to a product of the phase error value and the digital output signal.

6. The ADPLL of claim 5, wherein the normalization circuit comprises a least mean square (LMS) circuit, configured to generate a next gain parameter for a next cycle according to a product of the phase error value and the digital output signal and a current gain parameter utilized in a current cycle.

7. A calibration method of an all-digital phase-locked loop (ADPLL), comprising:
utilizing a digitally controlled oscillator (DCO) of the ADPLL to generate a clock signal according to a frequency control signal;
utilizing a time-to-digital converter (TDC) of the ADPLL to generate a digital output signal according to a phase error between the clock signal and a reference signal;
utilizing a normalization circuit of the ADPLL to convert the digital output signal into a clock phase value according to a gain parameter; and
utilizing the normalization circuit to modify the gain parameter according to a phase error value between the clock phase value and a reference phase value.

8. The calibration method of claim 7, wherein the step of utilizing the normalization circuit of the ADPLL to convert the digital output signal into the clock phase value according to the gain parameter comprises:
utilizing the normalization circuit to multiply the digital output signal by the gain parameter to generate the clock phase value.

9. The calibration method of claim 7, wherein the step of utilizing the normalization circuit to modify the gain parameter according to the phase error value between the clock phase value and the reference phase value comprises:
when the phase error value is positive, utilizing the normalization circuit to increase the gain parameter.

10. The calibration method of claim 7, wherein the step of utilizing the normalization circuit to modify the gain parameter according to the phase error value between the clock phase value and the reference phase value comprises:
when the phase error value is negative, utilizing the normalization circuit to decrease the gain parameter.

11. The calibration method of claim 7, wherein the step of utilizing the normalization circuit to modify the gain parameter according to the phase error value between the clock phase value and the reference phase value comprises:

utilizing the normalization circuit to modify the gain parameter according to the phase error value and the digital output signal.

12. The calibration method of claim 11, wherein the step of utilizing the normalization circuit to modify the gain parameter according to the phase error value and the digital output signal comprises:
utilizing the normalization circuit to modify the gain parameter according to a product of the phase error value and the digital output signal.

13. The calibration method of claim 12, wherein the step of utilizing the normalization circuit to modify the gain parameter according to the product of the phase error value and the digital output signal comprises:
according to the product of the phase error value and the digital output signal, and a current gain parameter utilized in a current cycle, utilizing a least mean square (LMS) circuit of the normalization circuit to generate a next gain parameter for a next cycle.

* * * * *